(12) United States Patent
Funahashi

(10) Patent No.: US 12,087,874 B2
(45) Date of Patent: Sep. 10, 2024

(54) MOUNTING BOARD, ELECTRONIC DEVICE, AND ELECTRONIC MODULE

(71) Applicant: Kyocera Corporation, Kyoto (JP)

(72) Inventor: Akihiko Funahashi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 318 days.

(21) Appl. No.: 17/771,661

(22) PCT Filed: Oct. 27, 2020

(86) PCT No.: PCT/JP2020/040233
§ 371 (c)(1),
(2) Date: Apr. 25, 2022

(87) PCT Pub. No.: WO2021/085413
PCT Pub. Date: May 6, 2021

(65) Prior Publication Data
US 2023/0268453 A1    Aug. 24, 2023

(30) Foreign Application Priority Data

Oct. 30, 2019    (JP) .................................. 2019-197453

(51) Int. Cl.
*H01L 31/12*        (2006.01)
*H01L 31/0232*      (2014.01)

(52) U.S. Cl.
CPC ........ *H01L 31/12* (2013.01); *H01L 31/02327* (2013.01)

(58) Field of Classification Search
CPC ............... H01L 31/12; H01L 31/02327; H01L 21/4807; H01L 21/565; H01L 31/16; H01L 23/02; H01L 23/053; H01L 23/12; H01L 25/04; H01L 25/18; H01L 25/165; H01L 25/167; H01L 31/0203; H01L 33/486; H01L 31/125; H05K 1/02; H05K 3/46

See application file for complete search history.

(56) References Cited

U.S. PATENT DOCUMENTS

| 2002/0014581 A1* | 2/2002 | Yamamoto ......... G01D 5/34715 250/231.13 |
| 2003/0103686 A1* | 6/2003 | Ogura .................. G06V 40/145 382/321 |

(Continued)

FOREIGN PATENT DOCUMENTS

| JP | 2008-235864 A | 10/2008 |
| JP | 2017-152530 A | 8/2017 |

(Continued)

*Primary Examiner* — Bitew A Dinke
(74) *Attorney, Agent, or Firm* — Volpe Koenig

(57) ABSTRACT

A mounting board includes a base portion and a frame portion. The base portion includes a first upper surface including a first mounting region. The frame portion includes a second upper surface including a second mounting region and an inner wall surface intersecting with the second upper surface. The inner wall surface of the frame portion includes a first portion connecting with the second upper surface, and a second portion located opposite to the first portion with the first mounting region interposed therebetween. In the second portion, a first film that absorbs light and having a reflectance lower than a reflectance of the inner wall surface of the frame portion is located.

16 Claims, 13 Drawing Sheets

(56) References Cited

U.S. PATENT DOCUMENTS

| | | | |
|---|---|---|---|
| 2009/0020778 A1* | 1/2009 | Noichi | H01L 25/167 |
| | | | 438/26 |
| 2012/0286310 A1* | 11/2012 | Kim | H01L 33/62 |
| | | | 257/E33.056 |
| 2013/0292705 A1* | 11/2013 | Makimura | H01L 31/035272 |
| | | | 257/81 |
| 2016/0011111 A1* | 1/2016 | Stoll | H01L 21/568 |
| | | | 250/226 |
| 2016/0187483 A1* | 6/2016 | Luan | G01S 7/4813 |
| | | | 250/221 |
| 2016/0240575 A1* | 8/2016 | Huang | H01L 25/167 |
| 2017/0207352 A1* | 7/2017 | Ho | H01L 31/173 |
| 2018/0114875 A1* | 4/2018 | Ho | H01L 31/143 |
| 2019/0035701 A1* | 1/2019 | Iwamoto | H01L 27/14636 |
| 2019/0207051 A1 | 7/2019 | Utsumi | |
| 2019/0259917 A1* | 8/2019 | Yamanaka | H05B 45/37 |
| 2020/0150404 A1* | 5/2020 | Chang | G02B 7/02 |
| 2020/0303583 A1 | 9/2020 | Utsumi | |

FOREIGN PATENT DOCUMENTS

| | | |
|---|---|---|
| JP | 2018-164021 A | 10/2018 |
| JP | 2019-129224 A | 8/2019 |
| WO | 2017/203953 A1 | 11/2017 |

\* cited by examiner

MOUNTING BOARD, ELECTRONIC DEVICE, AND ELECTRONIC MODULE

TECHNICAL FIELD

The present disclosure relates to a mounting board on which light receiving and emitting elements and the like are mounted, an electronic device, and an electronic module.

BACKGROUND ART

A mounting board on which a light receiving element and a light emitting element are mounted is known. (see WO 2017/203953). In such a mounting board, the light emitted by the light emitting element is reflected by a detection target and then received by the light receiving element to be detected.

Generally, in the mounting board including the light receiving element and the light emitting element, the light receiving element and the light emitting element may be mounted on an upper surface of a substrate and on the same flat surface. In this case, in order to prevent the light receiving element from directly receiving the light emitted by the light emitting element, a wall is provided with a housing or the like.

However, in recent years, downsizing of the mounting board has been required. Thus, a structure is conceivable in which a recessed portion is provided in the mounting board so as to narrow a space between the light receiving element and the light emitting element as much as possible, the light receiving element is mounted in the recessed portion, and the light emitting element is mounted on the recessed portion (front surface of the mounting board). However, with this structure, it is difficult to provide the wall with the housing or the like between the light receiving element and the light emitting element. As a result, there is a concern that a portion of the light from the light emitting element is reflected by a side wall of the recessed portion, and the reflected light reaches the light receiving element. Thus, there has been a concern that an electronic device malfunctions. Further, there has been concern that deepening of the recessed portion in the mounting board in order to reduce the malfunction is an obstacle to downsizing of the electronic device.

SUMMARY OF INVENTION

A mounting board according to one aspect of the present disclosure includes a base portion and a frame portion. The base portion includes a first upper surface including a first mounting region. The frame portion surrounds the first mounting region, and includes an inner wall surface extending upward from the first upper surface and a second upper surface that intersects with the inner wall surface and includes a second mounting region. The inner wall surface of the frame portion includes: a first portion connecting with the second upper surface; and a second portion located opposite to the first portion with the first mounting region interposed therebetween. In the second portion, a first film having a reflectance lower than a reflectance of the inner wall surface of the frame portion is located.

An electronic device according to one aspect of the present disclosure includes a mounting board, a light receiving element mounted in a first mounting region, and a light emitting element mounted in a second mounting region.

An electronic module according to one aspect of the present disclosure includes an electronic device and a lid located on the electronic device.

DESCRIPTION OF EMBODIMENTS

Configuration of Mounting Board and Electronic Device

Several exemplary embodiments of the present disclosure will be described hereinafter with reference to the drawings. In the following description, a configuration in which a light receiving element and a light emitting element are mounted on a mounting board, and in which the mounting board is covered with a lid is defined as an electronic device or an electronic module. Any direction may be defined as upward or downward for the mounting board and the electronic device, but for the sake of simplicity, an xyz orthogonal coordinate system is defined and a positive side in the z direction is defined as upward.

First Embodiment

Figure 1A:
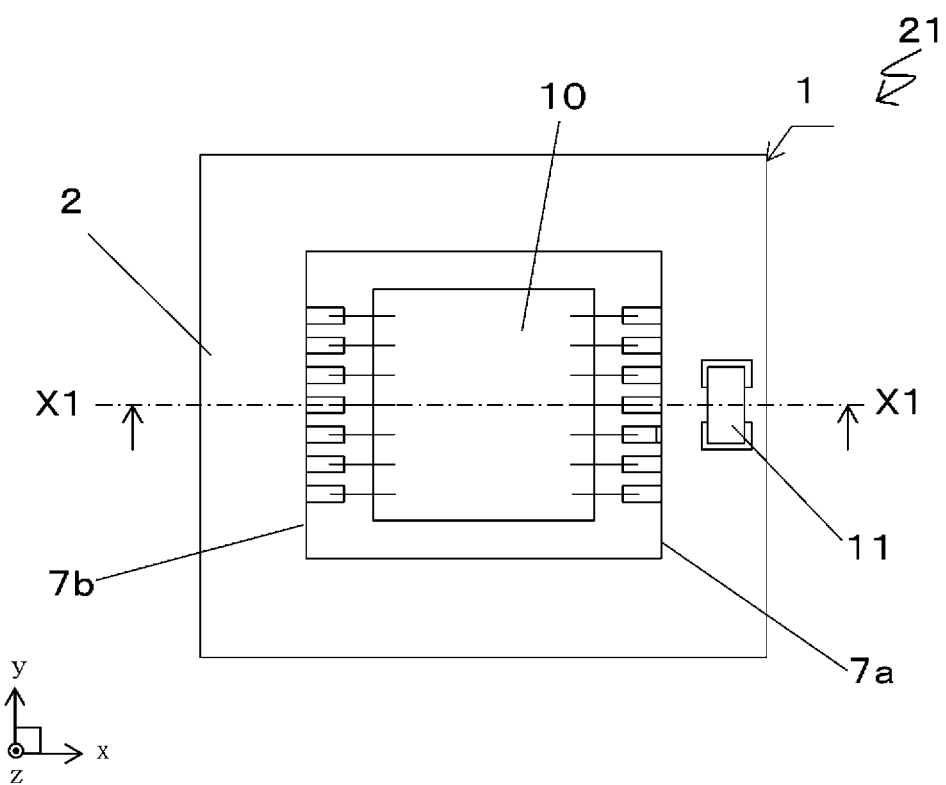
FIG. 1A is a top view illustrating the outer appearance of a mounting board and an electronic device according to a first embodiment of the present disclosure.
Figure 1B:
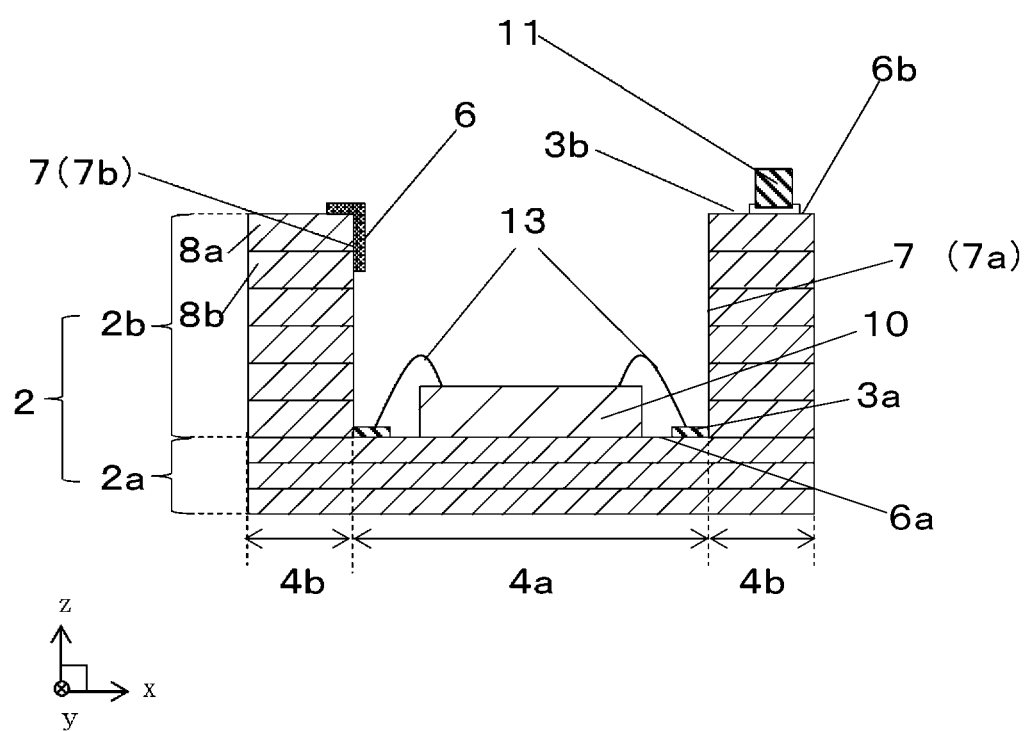
FIG. 1B is a vertical cross-sectional view corresponding to the line X1-X1 in FIG. 1A.
Figure 4:
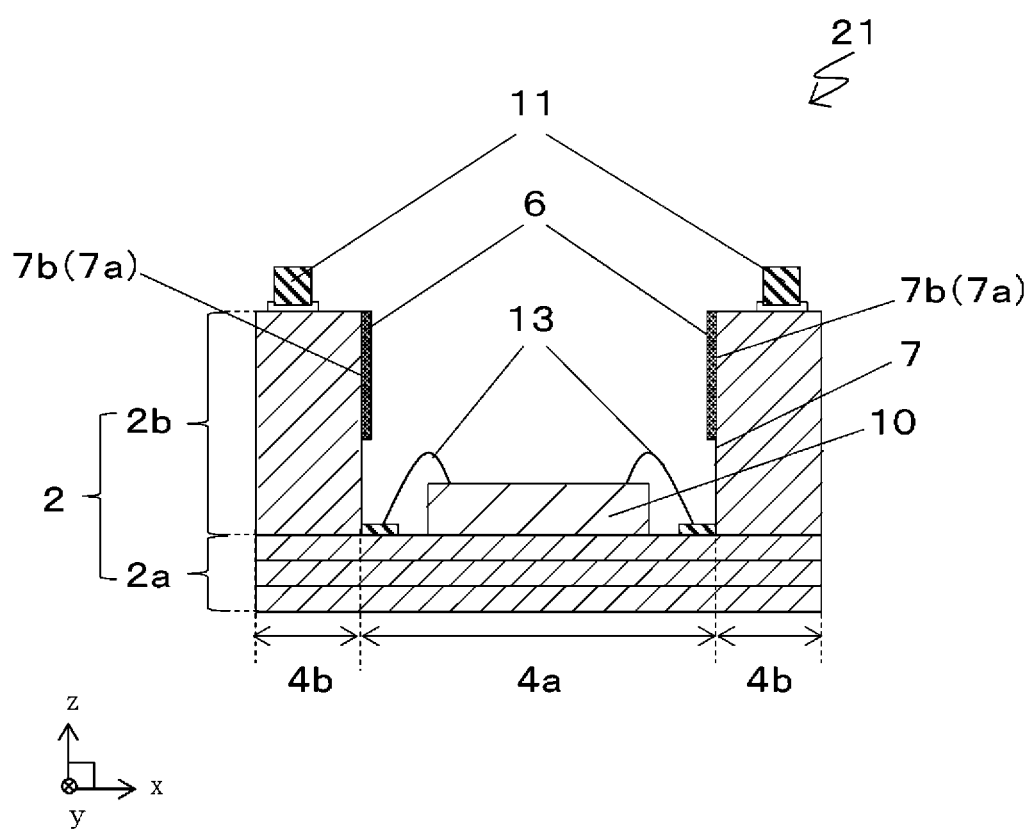
FIG. 4 is a vertical cross-sectional view illustrating a mounting board and an electronic device according to another aspect of the first embodiment of the present disclosure.
Figure 5:
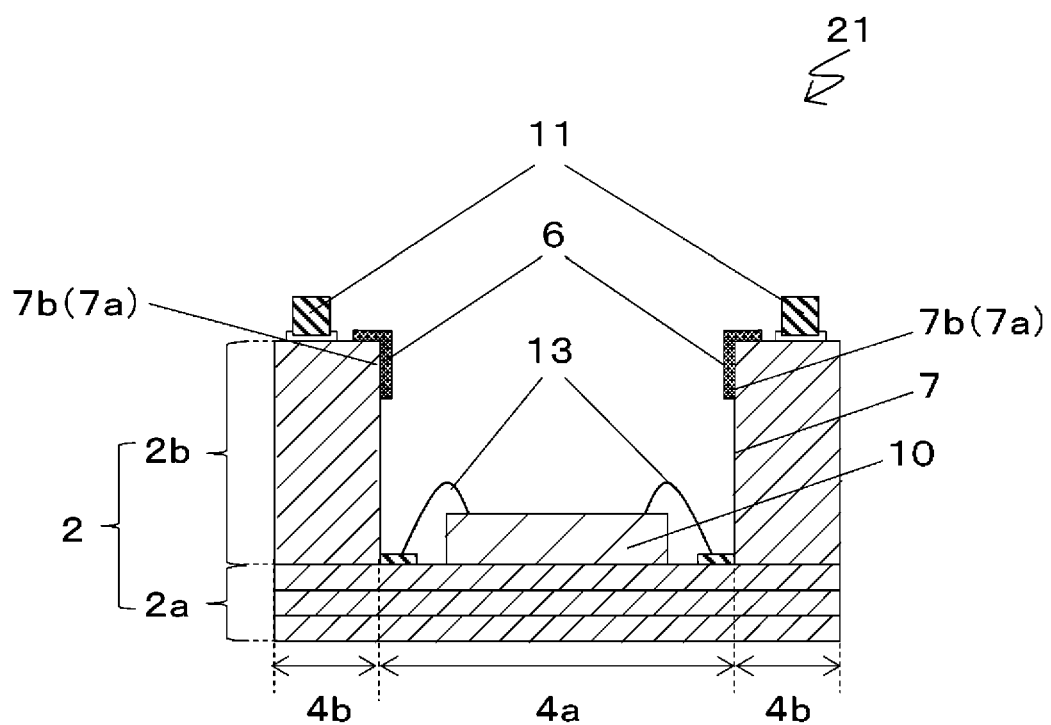
FIG. 5 is a vertical cross-sectional view illustrating a mounting board and an electronic device according to another aspect of the first embodiment of the present disclosure.

A mounting board 1 and an electronic device 21 provided with the mounting board 1 according to a first embodiment of the present disclosure will be described with reference to FIGS. 1A to 2B, and FIGS. 4 and 5. Note that FIG. 1A illustrates a top view of the electronic device 21, FIG. 1B illustrates a vertical cross-sectional view of the electronic device 21, and FIGS. 4 and 5 illustrate vertical cross-sectional views of the device. Note that a lid 12 is not illustrated in FIGS. 1A to 2B.

The mounting board 1 includes a base portion 2a and a frame portion 2b. The base portion 2a includes a first upper surface 6a including a first mounting region 4a. The first mounting region 4a may include a first electrode pad 3a electrically connected to a light receiving element 10. The frame portion 2b includes a second upper surface 6b including a second mounting region 4b and an inner wall surface 7 intersecting with the second upper surface 6b, and the frame portion is located on the first upper surface 6a of the base portion 2a so as to surround the first mounting region 4a. In the second mounting region 4b, at least one light emitting element 11 is mounted, and at least one second electrode pad 3b electrically connected to the light emitting element 11 is located. The frame portion 2b is on the first upper surface 6a of the base portion 2a and is located so as to surround the first mounting region 4a. The inner wall surface 7 of the frame portion 2b includes: a first portion 7a connecting with the second upper surface 6b; and a second portion 7b located opposite to the first portion 7a with the first mounting region 4a interposed therebetween.

The mounting board 1 includes the base portion 2a and the frame portion 2b. The base portion 2a includes the first mounting region 4a in which the first electrode pad 3a is located that is electrically connected to the light receiving element 10 on the first upper surface 6a. At least one light emitting element 11 is mounted on the second upper surface 6b of the frame portion 2b. The frame portion 2b includes at least one second mounting region 4b in which at least one second electrode pad 3b is located that is electrically connected to the light emitting element 11 on the second upper surface 6b. The first mounting region 4a is a region on which at least one or more light receiving elements 10 are mounted, and can be appropriately defined, for example, an inner side of the outermost periphery of the first electrode pad 3a, which will be described later, or an inner portion of the frame portion 2b. Further, as a component mounted on the first mounting region 4a, an electronic component may be further mounted other than the light receiving element 10, and the number of the light receiving elements 10 and/or the electronic components is not specified. The second mounting region 4b is a region on which at least one or more light emitting elements 11 are mounted, and can be appropriately defined, for example, an inside of the outermost periphery of the second electrode pad 3b, which will be described later, or an inner portion of the frame portion 2b. Further, in this case, an electronic component other than the light emitting element 11 may be further mounted. Further, the number of the light emitting elements 11 and the electronic components is not specified. Here, a combination of the base portion 2a and the frame portion 2b is referred to as a substrate 2.

Figure 2A:
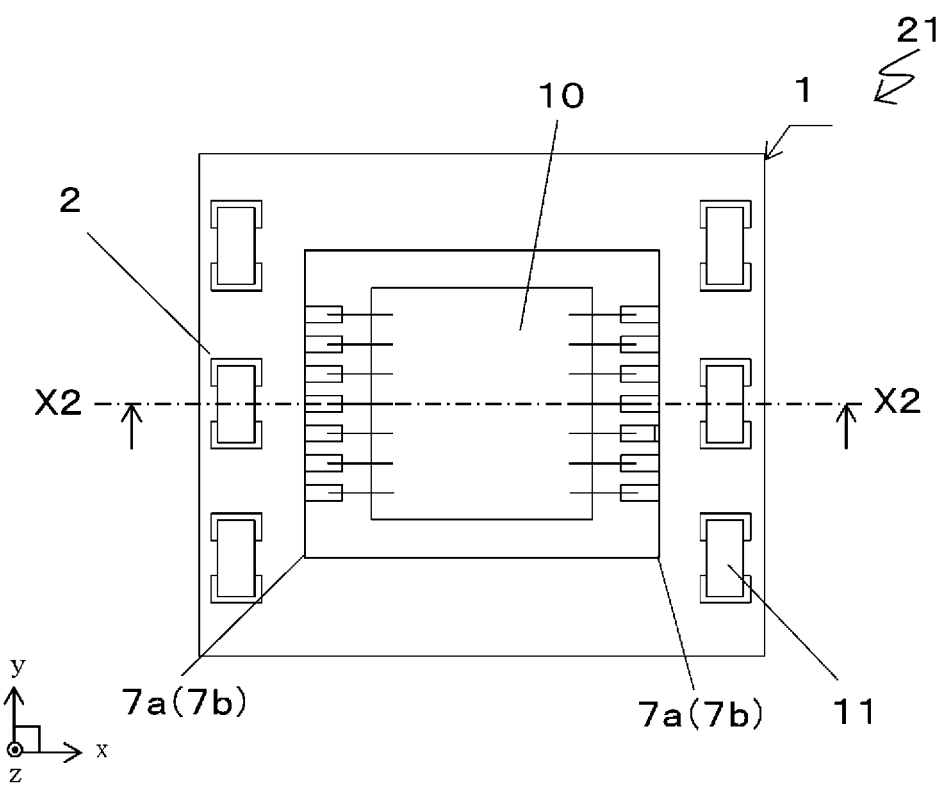
FIG. 2A is a top view illustrating the outer appearance of a mounting board and an electronic module according to the first embodiment of the present disclosure.
Figure 2B:
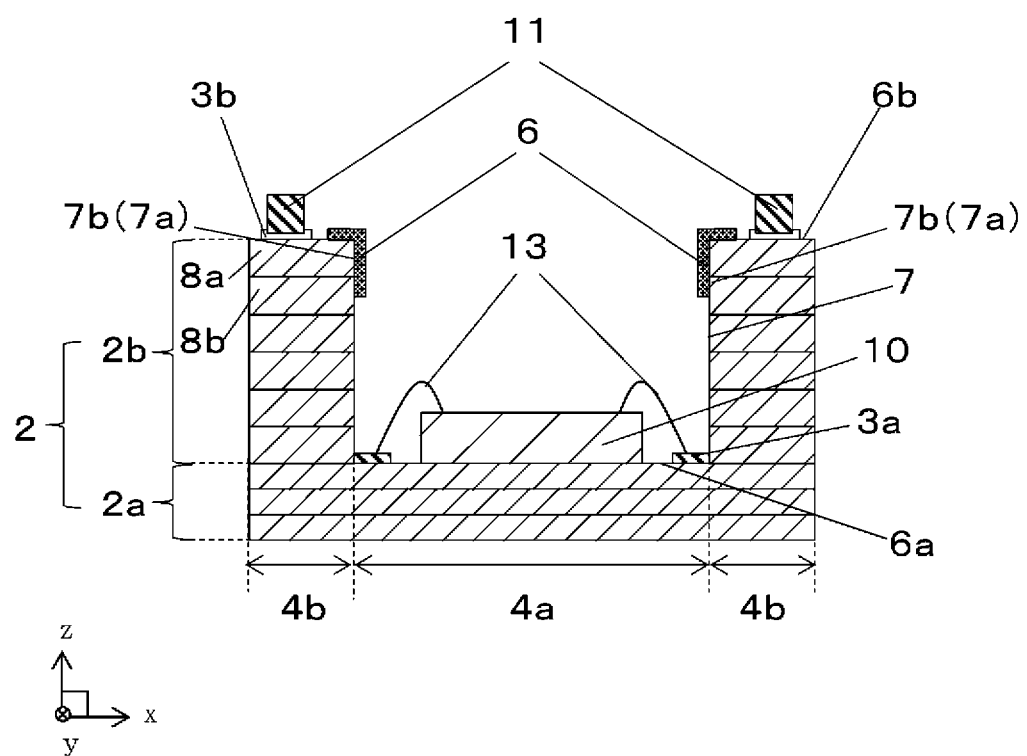
FIG. 2B is a vertical cross-sectional view corresponding to the line X2-X2 in FIG. 2A.

In the mounting board 1 illustrated in FIG. 1B and FIG. 2B, the base portion 2a and the frame portion 2b are formed of a plurality of layers. These plurality of layers are a plurality of insulating layers, and as in the example illustrated in FIG. 4 and FIG. 5, for example, a configuration formed with a mold, a configuration formed by pressing using a metal mold or the like, a configuration having only a single layer of the like may be adopted. Examples of the material of the insulating layers forming the substrate 2 include an electrically insulating ceramic and a resin.

Examples of the electrically insulating ceramic used as the material of the insulating layers included in the substrate 2 include an aluminum oxide-based sintered compact, a mullite-based sintered compact, a silicon carbide-based sintered compact, an aluminum nitride-based sintered compact, a silicon nitride-based sintered compact, and a glass ceramic sintered compact. Examples of the resin used as the material of the insulating layers forming the substrate 2 include a thermoplastic resin, an epoxy resin, a polyimide resin, an acrylic resin, a phenol resin, a fluorine-based resin, and the like. Examples of the fluorine-based resin include an ethylene tetrafluoride resin.

The substrate 2 may be formed of nine layers as illustrated in FIG. 1B and FIG. 2B, or may be formed of eight or less or ten or more of the plurality of layers. When the number of the plurality of layers is eight or less, the thickness of the mounting board 1 can be reduced. On the other hand, when the number of the plurality of layers is ten or more, the rigidity of the mounting board 1 can be increased. Further, an opening portion may be provided in each layer, a stepped portion may be formed on an upper surface of the provided opening portion having a different size, and the first electrode pad 3a and other electrodes described below may be provided in the stepped portion.

For example, one side of an outermost periphery of the mounting board 1 may have a size of from 0.3 mm to 10 cm, and when the mounting board 1 has a quadrilateral shape in a top view, the shape may be square or rectangular. Further, for example, the thickness of the mounting board 1 may be 0.2 mm or more.

An external circuit connection electrode may be provided on the side surface or the lower surface of the base portion 2a and the second upper surface 6b or the side surface of the frame portion 2b. The external circuit connection electrode may electrically connect the mounting board 1 to an external circuit board or the electronic device 21 to an external circuit board.

Further, in addition to the first electrode pad 3a, the second electrode pad 3b and/or the external circuit connection electrode, electrodes formed between insulating layers, internal wiring electrical conductors, and internal through-hole conductors vertically connecting the internal wiring electrical conductors to each other may be provided on the first upper surface 6a or lower surface of the substrate 2. These electrodes, internal wiring electrical conductors, or internal through-hole conductors may be exposed on the surface of the substrate 2. The first electrode pad 3a, the second electrode pad 3b, and/or the external circuit connection electrode may each be electrically connected by the electrodes, the internal wiring electrical conductors, or the internal through-hole conductors.

When the substrate 2 is made of an electrically insulating ceramic, the first electrode pad 3a, the second electrode pad 3b, the external circuit connection electrode, the electrodes, the internal wiring electrical conductors, and/or the internal through-hole conductors contain tungsten (W), molybdenum (Mo), manganese (Mn), palladium (Pd), silver (Ag), or copper (Cu), or an alloy containing at least one metal material selected from these metals, or the like. Further, those may contain only copper (Cu). When the substrate 2 is made of a resin, the first electrode pad 3a, the second electrode pad 3b, the external circuit connection electrode, the electrodes, the internal wiring electrical conductors, and/or the internal through-hole conductors contain copper (Cu), gold (Au), aluminum (Al), nickel (Ni), molybdenum (Mo), palladium (Pd), or titanium (Ti), or an alloy containing at least one metal material selected from these metals, or the like.

A plated layer may be further provided on the exposed surface of the first electrode pad 3a, the second electrode pad 3b, the external circuit connection electrode, the electrodes, the internal wiring electrical conductor, and/or the through-hole conductor. According to this configuration, oxidation can be suppressed by protecting the exposed surfaces of the external circuit connection electrode, the electrical conductor layer, and the through-hole conductors. Further, according to this configuration, the first electrode pad 3a and the light receiving element 10 can be favorably electrically connected via a bonding member 13 such as wire bonding. The plated layer may be formed by depositing a nickel (Ni) plated layer having a thickness of from 0.5 µm to 10 µm, or by sequentially depositing the nickel plated layer and a gold (Au) plated layer having a thickness of from 0.5 µm to 3 µm.

The frame portion 2b is on the first upper surface 6a of the base portion 2a and is located so as to surround the first mounting region 4a. In other words, the substrate 2 includes the recessed portion between the frame portion 2b and the base portion 2a, and the light receiving element 10 mounted in the first mounting region 4a is mounted on the inner side of the recessed portion.

The mounting board 1 includes the base portion 2a and the frame portion 2b. The base portion 2a includes the first mounting region 4a in which the light receiving element 10 is mounted on the first upper surface 6a. The frame portion 2b includes at least one second mounting region 4b in which at least one light emitting element 11 is mounted on the second upper surface 6b. The frame portion 2b is on the upper surface of the base portion 2a and is located so as to surround the first mounting region 4a. A first film 6, which is a coating that absorbs light, is located in the second portion 7b provided opposite to the first portion 7a connecting with the second upper surface 6b in which the second mounting region 4b of the frame portion 2b is located. Absorbing light means that the reflectance of the first film 6 is lower than the reflectance of the inner wall surface 7 of the frame portion 2b. This reflectance is the reflectance regarding the light emitted from the light emitting element 11. The reflectance may be the reflectance regarding visible light, which is scattered light. The reflectance can be identified based on the material of the target object, or may be measured with a colorimeter or the like.

Generally, in recent years, downsizing of electronic devices has been required. In response to this, a structure is conceivable in which the recessed portion is provided in the mounting board so as to narrow a space between the light receiving element and the light emitting element as much as possible, the light receiving element is mounted in the recessed portion, and the light emitting element is mounted on the recessed portion (surface of the mounting board). However, with this structure, it is difficult to provide the wall with the housing or the like between the light receiving element and the light emitting element, and there is a concern that a portion of the light from the light emitting element is reflected by a side wall of the recessed portion, and the reflected light reaches the light receiving element. Thus, there has been a concern that an electronic device malfunctions. Further, there has been a concern that deepening of the recessed portion in the mounting board in order to reduce malfunctions is an obstacle to downsizing of the electronic device.

In view of this, in the present embodiment, the mounting board 1 has the first film 6 that absorbs light, in the second portion 7b of the frame portion 2b. Accordingly, even in a case where a portion of the light from the light emitting element 11 reaches the inner wall surface 7 of the frame portion 2b, the light is absorbed by the first film 6 that absorbs light, whereby the occurrence of the reflection in the frame portion 2b can be reduced. Thus, it is possible to reduce the possibility of the light reflected by the inner wall surface 7 of the frame portion 2b reaching the light receiving element 10 and the electronic device 21 malfunctioning. Further, since it is possible to reduce malfunctions of the electronic device 21 without providing a wall with the housing or the like between the light emitting element 11 and the light receiving element 10, the electronic device 21 can be downsized.

The first film 6 that absorbs light is located in the second portion 7b located opposite to the first portion 7a in the inner wall surface 7. There may be a plurality of the second mounting regions 4b, and in this case, similarly there may be a plurality of the first films 6 that absorbs light. For example, in a case where the mounting board 1 has a rectangular shape, the second mounting regions 4b may be located at four sides, and in this case, the first films 6 that absorb light are located on all of the inner wall surfaces 7 of the frame portion 2b, in other words, on the entire circumference. Further, even in a case where the second mounting region 4b is one surface, there may be a plurality of surfaces of the first films 6 that absorb light. In other words, the number of the first films 6 may be equal to or greater than the number of the second mounting regions 4b.

The frame portion 2b may be, for example, molding processed using a mold as in the examples illustrated in FIG. 4 and FIG. 5, or may be composed of a plurality of layers as in the example illustrated in FIG. 1B. In any of these cases, the effect of the present embodiment can be achieved by applying the first film 6 that absorbs light as compared with at least the inner wall surface 7 of the frame portion 2b.

As in the example illustrated in FIG. 1B, FIG. 2B, and FIG. 5, the first film 6 may extend to the upper surface of the frame portion 2b. This makes it possible to reduce the possibility of irregular reflection of light on the second upper surface 6b of the frame portion 2b, whereby the occurrence of reflection of light on the inner wall surface 7 of the frame portion 2b can be further reduced. Thus, it is possible to improve the effect of the present embodiment.

Figure 3A:
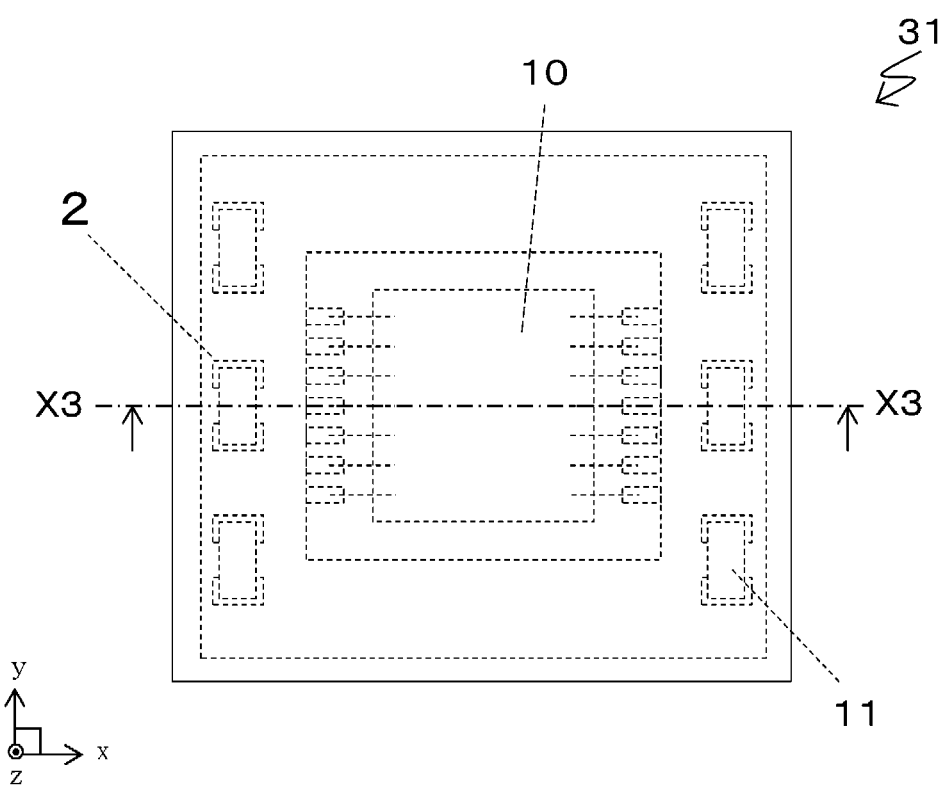
FIG. 3A is a top view illustrating the outer appearance of a mounting board and an electronic module according to a second embodiment of the present disclosure.
Figure 3B:
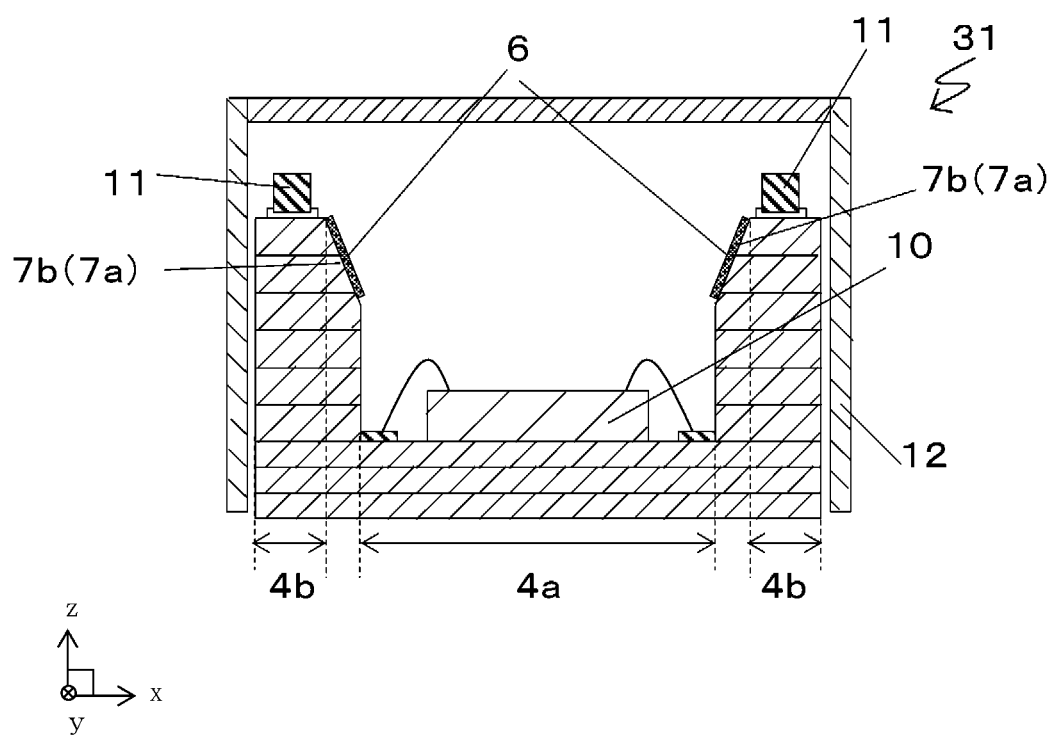
FIG. 3B is a vertical cross-sectional view corresponding to the line X3-X3 in FIG. 3A.

In a case where the frame portion 2b includes a plurality of layers as in the example illustrated in FIG. 1B and FIG. 2B as well as FIG. 3B illustrating a second embodiment described below, internal wiring can be provided between the layers in the frame portion 2b. Thus, the wiring of the mounting board 1 can have a degree of freedom, and electrical characteristics of the electronic device 21 can be improved. Further, when the frame portion 2b has a plurality of layers, the thickness of the frame portion 2b can be easily changed by the thickness and/or the number of layers. Thus, it is possible to more appropriately design and produce the height of the frame portion 2b under conditions such as the position of the light emitting element 11.

In a case where the frame portion 2b includes a plurality of insulating layers as in the examples illustrated in FIGS. 1B and 2B, as well as FIG. 3B and FIGS. 6 to 10 illustrating the second embodiment described below, the first film 6 may be provided on a part of the second portion 7b of the frame portion 2b in a cross-sectional view, or may be provided on all layers of the frame portion 2b in a cross-sectional view. With the first film 6 provided at least in the second portion 7b opposite to the first portion 7a in the inner wall surface 7, the effect of the present embodiment can be achieved.

Figure 8:
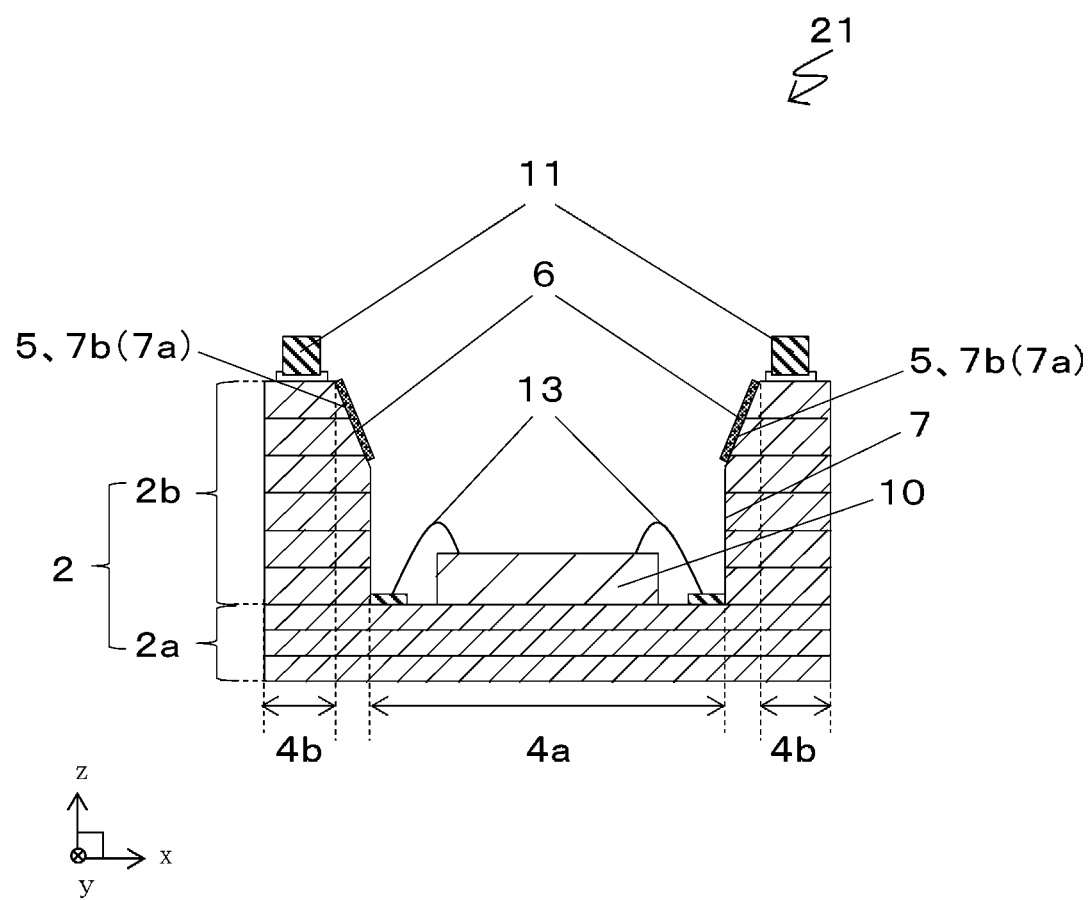
FIG. 8 is a vertical cross-sectional view illustrating a mounting board and an electronic device according to another aspect of the second embodiment of the present disclosure.
Figure 9:
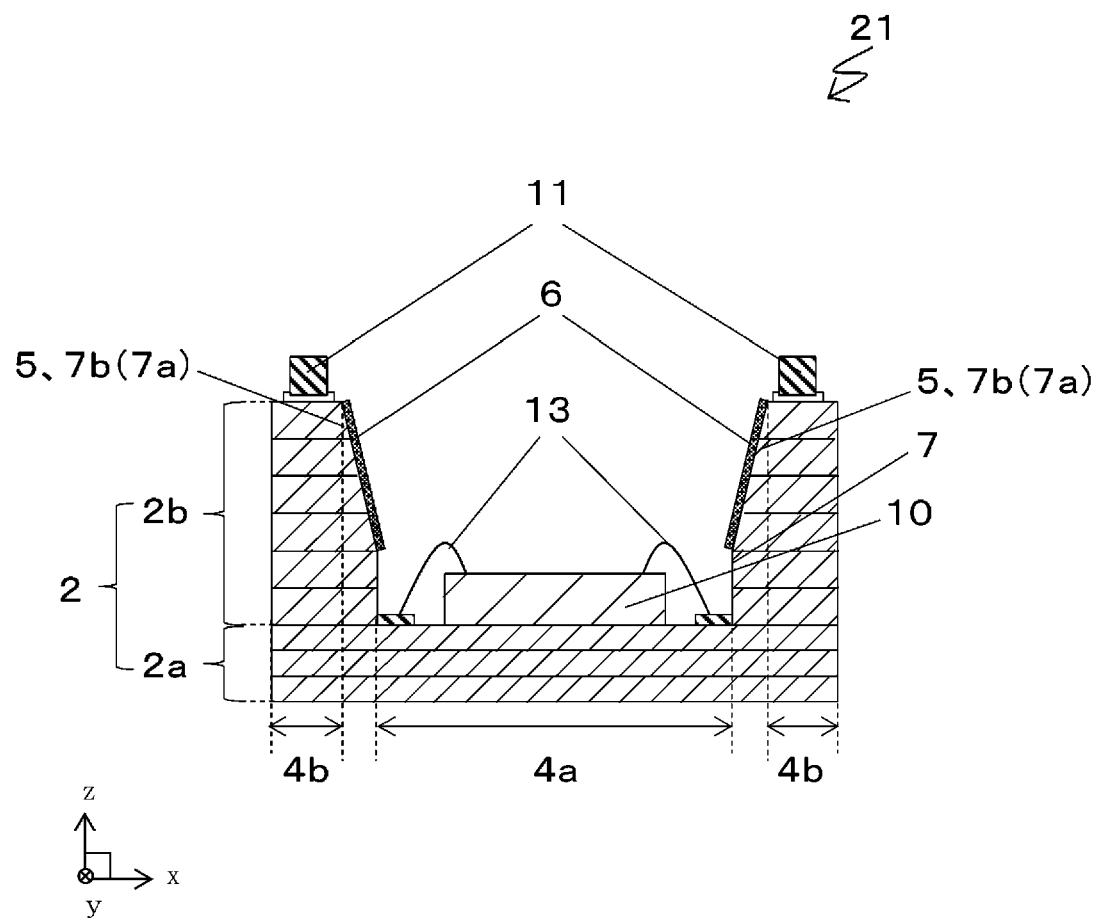
FIG. 9 is a vertical cross-sectional view illustrating a mounting board and an electronic device according to another aspect of the second embodiment of the present disclosure.

When the frame portion 2b is layered with a plurality of layers including a first layer 8a and a second layer 8b in this order from the top, the first layer 8a that is the uppermost layer may include the first film 6. Further, as illustrated in FIG. 8, the first film 6 may be located over the first layer 8a and the second layer 8b. According to this configuration, the second mounting region 4b can be ensured without increasing the size of the mounting board 1 even when the first film 6 is located in the frame portion 2b, and the effect of the present embodiment can be achieved.

The height of the frame portion 2b has a height at which the light receiving element 10 is housed within the frame portion 2b. With the frame portion 2b having the height at which the light receiving element 10 is housed within the frame portion 2b, light picked up from the outside can be reduced.

The first film 6 may be located on the entire circumference of the inner wall surface 7. Accordingly, even in a case where the light from the light emitting element 11 reaches a portion other than the opposing surface side, when a portion of the light is reflected at the inner wall surface 7 of the frame portion 2b, it is possible to reduce the reflection of the light to the light receiving element 10. Thus, it is possible to reduce the possibility of the light reflected by the inner wall surface 7 of the frame portion 2b reaching the light receiving element 10 and the electronic device 21 malfunctioning.

The base portion 2a and the frame portion 2b may be composed of a ceramic material as a main component, and the ceramic material may be black in this case. The base portion 2a and the frame portion 2b are composed of the ceramic material as the main component, and thus it possible to process the frame portion 2b by punching with a metal mold or the like. Thus, it is possible to reduce the occurrence of dusts from the frame portion 2b. Thus, it is possible to reduce the possibility that the dusts stick to the surface of the light receiving element 10 to generate a noise. Further, it is possible to reduce the roughness of the surface of the inner wall surface 7 of the frame portion 2b. Accordingly, even in a case where the light generated from the light emitting element 11 reaches the inner wall surface 7 of the frame portion 2b, it is possible to reduce the possibility that the light is irregularly reflected to reach the light receiving element 10. Further, the ceramic material is black, and thus it is possible to reduce the possibility of the light being reflected when the light generated from the light emitting element 11 reaches the inner wall surface 7 of the frame portion 2b. Thus the effect of the present embodiment can be achieved.

The base portion 2a and the frame portion 2b may be composed of a resin material as a main component. As a result, the frame portion 2b can be manufactured by a molding process such as a mold. Further, the resin material can reduce a glass component included in the frame portion 2b. Thus, it is possible to reduce the generation of the reflection of the light at the inner wall surface 7 of the frame portion 2b.

When the main component of the first film 6 that absorbs light is a ceramic material and when the main component of the frame portion 2b is a ceramic material, the frame portion 2b and the first film 6 that absorbs light can be more tightly bonded to each other by glass sintering. Thus, the possibility of separation of the first film 6 from the frame portion 2b due to aging of the electronic device 21 can be reduced, whereby the effect of the present embodiment can be provided for an extended period of time. When the main component of the first film 6 that absorbs light is a ceramic material, the ceramic material may be black. Examples of the ceramic material of the first film 6 include a silicon carbide sintered compact. With the first film 6 being a black ceramic material, it is possible to further reduce the possibility of the light being reflected when the light generated from the light emitting element 11 reaches the inner wall surface 7 of the frame portion 2b. Therefore, it is possible to further improve the effect of the present embodiment.

When the main component of the first film 6 that absorbs light is a resin material. the glass component included in the frame portion 2b can be reduced. Thus, it is possible to reduce the generation of the reflection of the light at the inner wall surface 7 of the frame portion 2b. Thus, it is possible to improve the effect of the present embodiment.

Configuration of Electronic Device

An example of the electronic device 21 is illustrated in FIGS. 1A to 2B as well as FIGS. 3A and 3B illustrating the second embodiment described below. The electronic device 21 includes the mounting board 1, the light receiving element 10 mounted in the first mounting region 4a of the mounting board 1, and the light emitting element 11 mounted in the second mounting region 4b.

The electronic device 21 includes the mounting board 1, the light receiving element 10 mounted in the first mounting region 4a, and the light emitting element 11 mounted in the second mounting region 4b. An example of the light receiving element 10 is, for example, a reflective CMOS sensor or a PD sensor. An example of the light emitting element 11 is a Light Emitting Diode (LED) or a VCSEL element. The light receiving element 10 and the mounting board 1, and the light emitting element 11 and the mounting board 1 may be electrically connected to each other by, for example, the bonding member 13.

The electronic device 21 includes the mounting board 1 illustrated in the present embodiment, and thus a space between the light receiving element 10 and the light emitting element 11 can be made smaller in a top view, and the electronic device 21 can be downsized.

In the electronic device 21, in a cross-sectional view, an upper end of the light receiving element 10 is located below a lower end of the light emitting element 11. Accordingly, even in a case where a portion of the light from the light emitting element 11 is reflected by the inner wall surface 7 of the frame portion 2b, it is possible to further reduce the reflection of the light to the light receiving element 10. Therefore, it is possible to further improve the effect of the present embodiment. Further, the first film 6 may be located above an upper end of the light receiving element 10. Accordingly, since the first film 6 is located at a location on which the light from the light emitting element 11 is more likely to be incident, even in a case where a portion of the light from the light emitting element 11 is reflected by the inner wall surface 7 of the frame portion 2b, it is possible to further reduce the possibility of the reflection of the light to the light receiving element 10.

Figure 10:
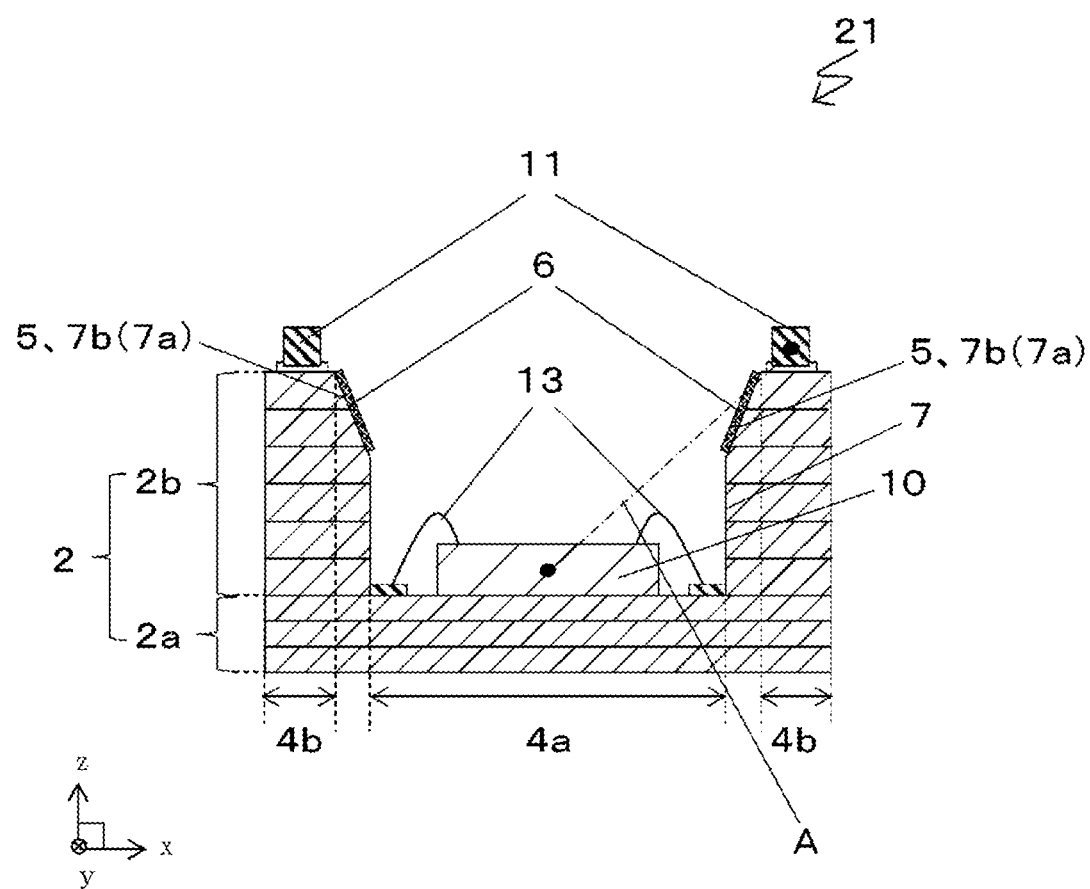
FIG. 10 is a vertical cross-sectional view illustrating a mounting board and an electronic device according to another aspect of the second embodiment of the present disclosure.

In a cross-sectional view, as illustrated in FIG. 10, in the electronic device 21, the second upper surface 6b of the frame portion 2b, in particular, the inner end of the second upper surface 6b of the frame portion 2b may be located above an imaginary line A connecting the center of the light receiving element 10 and the center of the light emitting element 11. Accordingly, even in a case where a portion of the light from the light emitting element 11 is reflected by the inner wall surface 7 of the frame portion 2b, it is possible to further reduce the reflection of the light to the light receiving element 10. Therefore, it is possible to further improve the effect of the present embodiment.

Configuration of Electronic Module

An electronic module 31 includes the electronic device 21 and the lid 12 located on an upper surface of the electronic device 21.

The electronic module 31 may include the lid 12 covering the electronic device 21. The lid 12 may have a flat plate shape, or may be shaped like a housing (lens holder). The lid 12 may have a shape in which a housing made of a metal or a resin as a material and a plate-like transparent member made of a resin or a glass material as a material are combined, or may have a flat plate shape such as a glass plate. The lid 12 has a shape in which the housing and the plate material are combined, and thus it is possible to further improve airtightness or reduce the direct application of stress from the outside to the electronic device 21. Note that the electronic module 31 may have the lid 12 bonded to the electronic device 21, and further have a housing covering the electronic device 21. With the housing further included, airtightness can be improved or the direct application of stress from the outside to the electronic device 21 can be reduced. The housing and the lid 12 are made of, for example, a resin, a metal material, or the like. When the lid 12 is a lens holder, one or more lenses made of a resin, a liquid, glass, a crystal, or the like may be incorporated into the lid 12. In addition, the lid 12 may be equipped with a drive device or the like configured to drive up, down, left, and right, and may be electrically connected to a pad or the like located on the front surface of the mounting board 1 via a bonding member such as solder.

Note that the lid 12, in a top view, may be provided with an opening portion on at least one side in any of four directions. Further, an external circuit board may be inserted through the opening portion of the lid 12 and electrically connected to the mounting board 1. In addition, after the external circuit board has been electrically connected to the mounting board 1, the opening portion of the lid 12 may be sealed with a sealing material such as a resin or the like, such that the inside of the electronic module 31 may be hermetically sealed. Note that the electronic module 31 may separately include a lid that further covers the light receiving element 10. When the electronic module 31 includes a housing separately from the lid 12, the housing may include an opening portion. Also in this case, the opening portion may be similarly sealed with a sealing material such as a resin or the like, such that the inside of the electronic module 31 may be hermetically sealed.

Method of Manufacturing Mounting Board and Electronic Device

Next, an example of a method of manufacturing the mounting board 1 and the electronic device 21 according to the present embodiment will be described. Note that as the example of the manufacturing method, a method of manufacturing the substrate 2 using a multipiece wiring board will be described below.

(1) First, ceramic green sheets that form the substrate 2 (the base portion 2a and the frame portion 2b) are formed. For example, in the case of obtaining the substrate 2 that is an aluminum oxide ($Al_2O_3$)-based sintered compact, a powder such as silica ($SiO_2$), magnesia (MgO), or calcia (CaO) is added as a sintering aid to the $Al_2O_3$ powder. A suitable binder, a solvent, and a plasticizer are furthermore added to this, and the mixture is kneaded together into a slurry. Then, multipiece ceramic green sheets are obtained by a formation method, such as a doctor blade method or a calendar roll method.

Note that when the substrate 2 is made of a resin, for example, the substrate 2 can be formed by a transfer molding method, an injection molding method, pressing with a metal mold, or the like, using a metal mold capable of forming the resin into a predetermined shape. Further, the material of the substrate 2 may be a base material made of glass fibers impregnated with a resin, such as a glass epoxy resin. In this case, the substrate 2 can be formed by impregnating a base material made of glass fibers with an epoxy resin precursor and thermally curing the epoxy resin precursor at a predetermined temperature.

(2) Next, by a screen printing method or the like, a metal paste is applied to or caused to fill portions of the ceramic green sheets obtained in the above step (1), the portions being expected to serve as the first electrode pad 3a, the second electrode pad 3b, the external circuit connection electrode, the electrodes, the internal wiring electrical conductors, and/or the internal through-hole conductors. This metal paste is created so as to have appropriate viscosity by adding a suitable solvent and binder to the metal powder formed of the above-described metal materials, and kneading the mixture. Note that a glass or ceramics may also be included in the metal paste in order to increase the bonding strength with the substrate 2.

Further, when the substrate 2 is made of a resin, the first electrode pad 3a, the second electrode pad 3b, the external circuit connection electrode, the electrodes, the internal wiring electrical conductors, and/or the internal through-hole conductors can be manufactured by sputtering, vaporizing, or the like. Furthermore, those may be manufactured by using a plating method after providing a metal film on the surface.

(3) Next, the aforementioned green sheet is processed using a metal mold or the like. Here, when the substrate 2 has an opening portion, a cutout section or the like, the opening portion, the cutout section or the like may be formed at a predetermined portion of the green sheet to be the substrate 2.

(4) Subsequently, the ceramic green sheets to be respective insulating layers of the substrate 2 are layered and placed under pressure. In this way, the ceramic green sheets to be insulating layers may be layered to produce a ceramic green sheet laminated body to be the substrate 2. Further, in this case, an opening portion of the frame portion 2b may be provided at predetermined positions by using a metal mold, a punching, a laser, or the like, in the ceramic green sheet in which the plurality of layers are layered. Note that after an opening portion is provided in the ceramic green sheet or the ceramic green sheet laminated body, the first film 6, which is a coating that absorbs light, can be produced by being applied at least to the second portion 7b of the inner wall surface 7 of the frame portion 2b.

(5) Subsequently, the ceramic green sheet laminated body is fired at a temperature of from approximately 1500° C. to 1800° C. to obtain the multipiece wiring board in which a plurality of the mounting boards 1 are arrayed. Note that, in this step, the above-described metal paste is fired at the same time as the ceramic green sheets forming the mounting board 1, and forms the first electrode pad 3a, the second electrode pad 3b, the external circuit connection electrode, the electrodes, the internal wiring electrical conductors, and/or the internal through-hole conductors.

(6) Next, the multipiece wiring board obtained by the firing may be divided into the plurality of mounting boards 1. In this division, a method can be used in which split grooves are formed in the multipiece wiring board in locations that will serve as the outer edges of the mounting boards 1, and the multipiece wiring board may then be divided along those split grooves. Alternatively, a method can be used in which the multipiece wiring board is cut, by slicing and the like, along the locations that will serve as the outer edges of the mounting boards 1. Note that the split grooves can be formed by using a slicing device to cut to a depth less than the thickness of the multipiece wiring board after firing. Furthermore, the split grooves can be formed by pressing a cutter blade against the ceramic green sheet laminated body used as the multipiece wiring board, or by using a slicing device to form cuts having a depth less than the thickness of the ceramic green sheet laminated body. Note that, before or after dividing the multipiece wiring board described above into the plurality of mounting boards 1, the plating may be applied to the first electrode pad 3a, the second electrode pad 3b, external connection pads, and the exposed wiring conductors using an electrolytic or electroless plating method, respectively.

(7) Next, the light receiving element 10 and the light emitting element 11 of the mounting board 1 are mounted in the first mounting region 4a and in the second mounting region 4b, respectively. The light receiving element 10 is electrically bonded to the mounting board 1 by the bonding member 13 such as wire bonding or the like. In this case, an adhesive or the like may be provided on the light receiving element 10 or the mounting board 1 to fix the light receiving element 10 to the mounting board 1. Further, after the light receiving element 10 and the light emitting element 11 are mounted on the mounting board 1, the lid 12 may be bonded to the mounting board 1.

The electronic device 21 can be manufactured by manufacturing the mounting board 1 as described in steps (1) to (7) and mounting the light receiving element 10 and the light emitting element 11 on the mounting board 1. Note that the order of the above-described steps (1) to (7) can be changed to another order in which the process can be performed.

Second Embodiment

The mounting board 1 according to the present embodiment is different from the mounting board 1 according to the first embodiment in that the second portion 7b has an inclined surface 5 and the surface of the inclined surface 5 has the first film 6 that absorbs light.

In the example illustrated in FIG. 3B, and FIGS. 6 to 10, the first film 6 that absorbs light is located on the inclined surface 5 of the mounting board 1. In other words, in a cross-sectional view, the inner wall surface 7 of the frame portion 2b, in which the first film 6 that absorbs light is located, has the inclined surface 5 inclined away from the first portion 7a as it goes away from the first upper surface 6a of the base portion 2a, and the diameter (width) of an opening in the inner wall surface 7 having the inclined surface 5 increases upward. With such a structure, even in a case where a portion of the light from the light emitting element 11 reaches the inner wall surface 7 of the frame portion 2b, the light is absorbed by the first film 6 that absorbs light, and even when a portion of the light from the light emitting element 11 is failed to be fully absorbed and is reflected due to the inclined surface 5, the light that has failed to be absorbed is reflected in such a direction as not to enter the light receiving element 10. As a result, it is possible to reduce the possibility of direct light and scattered light from the light emitting element 11 reaching the light receiving element 10. Thus, it is possible to reduce the possibility of the light reflected by the inner wall surface 7 of the frame portion 2b reaching the light receiving element 10 and the electronic device 21 malfunctioning. Further, since it is possible to reduce malfunctions of the electronic device 21 without providing a wall with the housing between the light emitting element 11 and the light receiving element 10, the electronic device 21 can be downsized. In this case, the frame portion 2b may have a plurality of layers, and the inclined surface 5 may be located over a plurality of layers as in the example illustrated in FIG. 3B, FIG. 6, and FIGS. 8 to 10. This makes it easy to set the size and inclination of the inclined surface 5 as desired. Thus, the first film 6 is easy to apply, and an angle with which the light from the light emitting element 11 is hardly reflected to the light receiving element 10 side can be easily produced, whereby the effect of the present embodiment can be further improved.

The inclination angle of the inclined surface 5 of the mounting board 1 may be from 30° to 60° with respect to the first upper surface 6a. The angle of the inclined surface 5 is from 30° to 60° with respect to the first upper surface 6a, so that it is possible to have the effect of reflecting the light to the upward side of the frame portion 2b when the light from the light emitting element 11 reaches the inclined surface 5, and the second mounting region 4b on which the light emitting element 11 is mounted is easily ensured on the second upper surface 6b of the frame portion 2b. Thus, the effect of the present embodiment can be achieved, and it is possible to downsize the electronic device 21.

Figure 6:
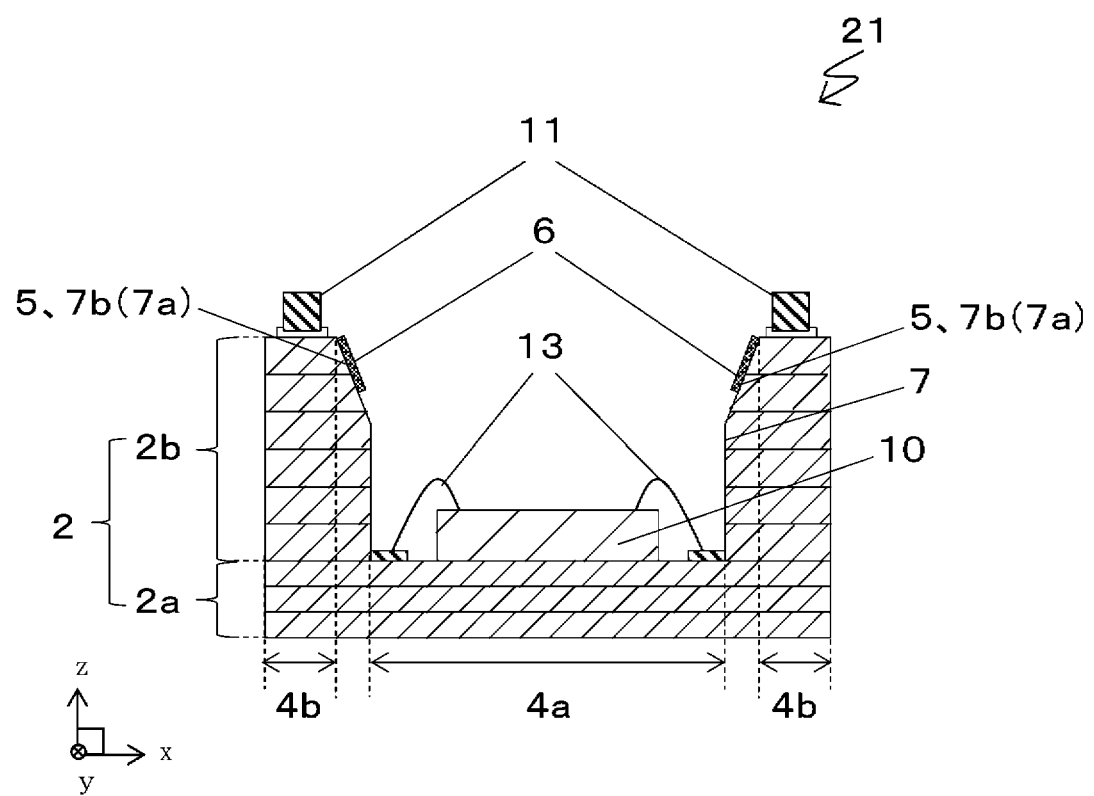
FIG. 6 is a vertical cross-sectional view illustrating a mounting board and an electronic device according to another aspect of the second embodiment of the present disclosure.
Figure 7:
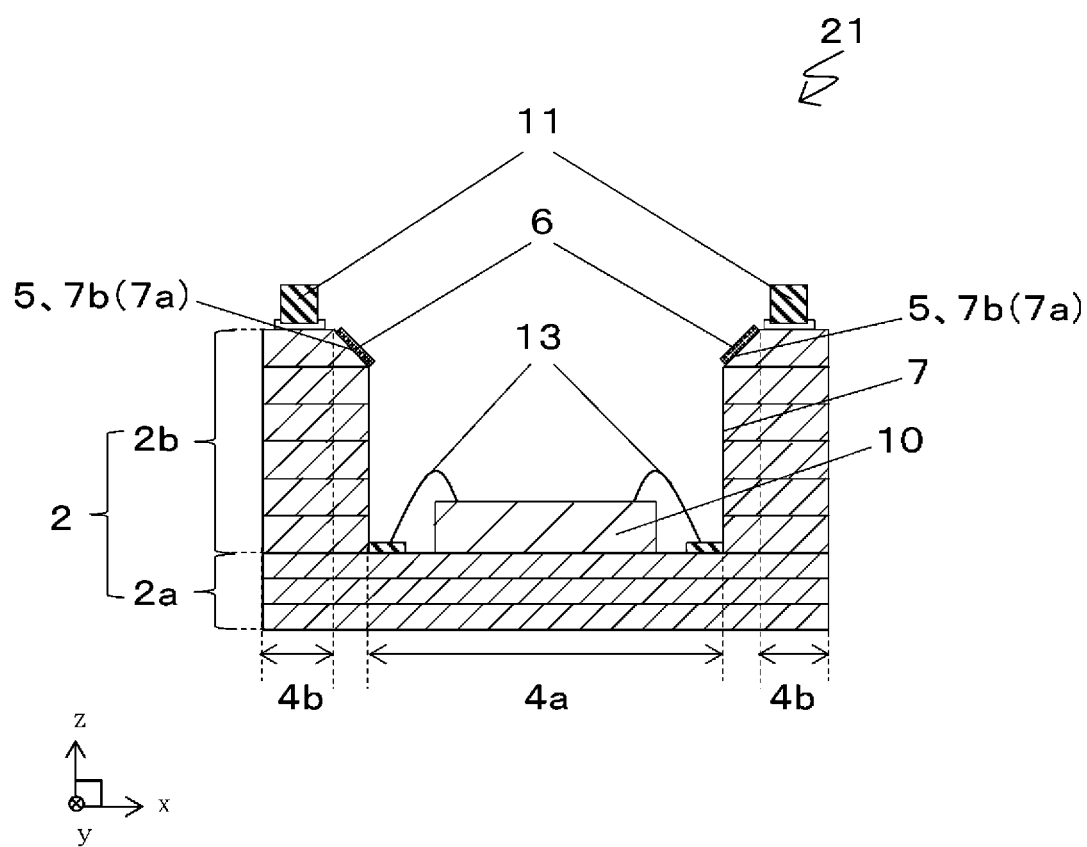
FIG. 7 is a vertical cross-sectional view illustrating a mounting board and an electronic device according to another aspect of the second embodiment of the present disclosure.

As illustrated in FIG. 3B, and FIGS. 7 to 9, the first film 6 that absorbs light may be located on the entire surface of the inclined surface 5, and as in the example illustrated in FIG. 6, the first film 6 that absorbs light may be located only on a part of the inclined surface 5. With the first film 6 that absorbs light being located on the entire surface of the inclined surface 5 as in the examples illustrated in FIG. 3B, and FIGS. 7 to 9, the effect of the present embodiment can be achieved even in a case where the light from the light emitting element 11 reaches the inner wall surface 7 of the frame portion 2b at various angles or locations. With the first film 6 that absorbs light being located only on a part of the inclined surface 5 as in the example illustrated in FIG. 6, it is possible to reduce the possibility of the bonding member 13 and the first film 6 coming into contact with each other even in a case where the electronic device 21 has a lower height. In addition, in a case where the electronic device 21 is downsized and has a lower height, it is possible to reduce the possibility of the reflected light that should reach the light receiving element 10 being blocked due to the first film 6 casting a shadow. Thus, the electronic device 21 can be downsized and have a lower height.

The first film 6 is located along the inclined surface 5. In such a case, the effect of the present embodiment can be achieved as well. In this case, the thickness of the first film 6 may be constant. This makes it possible to uniformly absorb the light from the light emitting element 11, and to reduce the difference in the degree of absorption of light depending on the angle of the light from the light emitting element 11. Thus, it is possible to further stabilize the operation of the electronic device 21.

A part of the first film 6 may be thicker. With a part of the first film 6 being thicker, the first film 6 at which the light from the light emitting element 11 is likely to be concentrated can be made thicker, whereby the effect of the present embodiment can be further improved.

In a cross-sectional view, as in the example illustrated in FIG. 10, in the electronic device 21, the second upper surface 6b of the frame portion 2b, in particular, the inner end of the second upper surface 6b of the frame portion 2b may be located above the imaginary line A connecting the center of the light receiving element 10 and the center of the light emitting element 11. Accordingly, even in a case where a portion of the light from the light emitting element 11 is reflected by the inner wall surface 7 of the frame portion 2b, it is possible to further reduce the reflection of the light to the light receiving element 10. Therefore, it is possible to further improve the effect of the present embodiment. In the electronic device 21, the first film 6 may extend farther downward than the imaginary line A connecting the center of the light receiving element 10 and the center of the light emitting element 11. Thus, it is possible to further improve the effect of the present embodiment.

The manufacturing method of the mounting board 1 and the electronic device 21 illustrated in FIGS. 3A and 3B, FIGS. 6 to 10 can be achieved by combining the steps of the first embodiment and the second embodiment. That is, it is possible to produce the inclined surface 5 along the steps of the first embodiment, and to produce the first film 6 that absorbs light by being applied or printed on the surface of the inclined surface 5.

The present disclosure is not limited to the above-described embodiments, and various modifications can be made to numerical values and the like. Further, for example, in the examples illustrated in the respective figures, the first electrode pad 3a and the second electrode pad 3b have a rectangular shape in a top view, but may be circular or have another polygonal shape. The arrangement, number, and shape of the first electrode pad 3a and the second electrode pad 3b, the mounting method of the electronic element, and the like in the present embodiments are not specified. Note that various combinations of characteristic portions of the present embodiments are not limited to the examples in the embodiments. Further, combinations of the respective embodiments are also possible.

REFERENCE SIGNS LIST

1 Mounting board
2 Substrate
2a Base portion
2b Frame portion
3a First electrode pad
3b Second electrode pad
4a First mounting region
4b Second mounting region
5 Inclined surface
6 First film
6a First upper surface
6b Second upper surface
7 Inner wall surface
7a First portion
7b Second portion
8a First layer
8b Second layer
10 Light receiving element
11 Light emitting element
12 Lid
13 Bonding member
21 Electronic device
31 Electronic module
A Virtual line

The invention claimed is:
1. A mounting board comprising:
a base portion comprising a first upper surface comprising a first mounting region;
a frame portion surrounding the first mounting region, the frame portion comprising
an inner wall surface extending upward from the first upper surface and
a second upper surface intersecting with the inner wall surface and comprising a second mounting region,
wherein the inner wall surface of the frame portion comprises a first portion connecting with the second upper surface, and a second portion located opposite to the first portion with the first mounting region interposed between the first portion and the second portion, and
in the second portion, a first film having a reflectance lower than a reflectance of the inner wall surface of the frame portion is located.
2. The mounting board according to claim 1,
wherein the first film extends to the second upper surface of the frame portion.
3. The mounting board according to claim 1,
wherein the second portion comprises an inclined surface inclined away from the first portion as the inclined surface gets away from the first upper surface of the base portion.
4. The mounting board according to claim 3,
wherein the first film is located on the inclined surface.
5. The mounting board according to claim 1,
wherein the frame portion comprises a plurality of layers layered,
the plurality of layers comprise a first layer and a second layer in order from the second upper surface of the frame portion,
the second portion is located over the first layer and the second layer, and
in a cross-sectional view, the first film is located over the first layer and the second layer.
6. The mounting board according to claim 3,
wherein the frame portion comprises a plurality of layers layered, and
the inclined surface is located over at least two layers of the plurality of layers.
7. The mounting board according to claim 3,
wherein an inclination angle of the inclined surface with respect to the first upper surface is from 30° to 60°.
8. The mounting board according to claim 1,
wherein the first film has a uniform thickness.
9. The mounting board according to claim 1,
wherein the first film is located on an entire circumference of the inner wall surface.
10. The mounting board according to claim 1,
wherein the first film is composed of a ceramic material as a main component.
11. The mounting board according to claim 10,
wherein the ceramic material is black.
12. An electronic device comprising:
the mounting board described in claim 1;
a light receiving element mounted in the first mounting region; and
a light emitting element mounted in the second mounting region.
13. The electronic device according to claim 12,
wherein an upper end of the light receiving element is located below a lower end of the light emitting element.
14. The electronic device according to claim 12,
wherein an upper surface of the frame portion is located above an imaginary line connecting a center of the light receiving element and a center of the light emitting element.

15. The electronic device according to claim 12, wherein the first film is located above an upper end of the light receiving element.

16. An electronic module comprising:
the electronic device described in claim 12; and
a lid located on the electronic device.

\* \* \* \* \*